United States Patent
Carrigan

(10) Patent No.: US 11,394,377 B2
(45) Date of Patent: Jul. 19, 2022

(54) PULSE RATIO MODULATION

(71) Applicant: THE JOHNS HOPKINS UNIVERSITY, Baltimore, MD (US)

(72) Inventor: Joseph T. Carrigan, Columbia, MD (US)

(73) Assignee: The Johns Hopkins University, Baltimore, MD (US)

(*) Notice: Subject to any disclaimer, the term of this patent is extended or adjusted under 35 U.S.C. 154(b) by 285 days.

(21) Appl. No.: 15/999,841

(22) PCT Filed: Feb. 20, 2017

(86) PCT No.: PCT/US2017/018561
§ 371 (c)(1),
(2) Date: Aug. 20, 2018

(87) PCT Pub. No.: WO2017/143315
PCT Pub. Date: Aug. 24, 2017

(65) Prior Publication Data
US 2021/0218392 A1    Jul. 15, 2021

Related U.S. Application Data

(60) Provisional application No. 62/296,721, filed on Feb. 18, 2016.

(51) Int. Cl.
| H03K 7/00 | (2006.01) |
| H03K 7/06 | (2006.01) |
| H03K 3/017 | (2006.01) |
| H03K 5/04 | (2006.01) |

(52) U.S. Cl.
CPC ............ *H03K 7/06* (2013.01); *H03K 3/017* (2013.01); *H03K 5/04* (2013.01)

(58) Field of Classification Search
None
See application file for complete search history.

(56) References Cited

U.S. PATENT DOCUMENTS

| 7,437,654 B2 | 10/2008 | Das et al. |
| 7,454,222 B2 | 11/2008 | Huang et al. |

(Continued)

FOREIGN PATENT DOCUMENTS

| WO | 2013054072 A1 | 4/2013 |
| WO | 2015100210 A1 | 7/2015 |
| WO | 2015112493 A1 | 7/2015 |

OTHER PUBLICATIONS

Barth et al., Bodycoupled communication for body sensor networks. In: Proceedings of the ICST 3rd International Conference on Body Area Networks (2008).

Chang et al., Body area network security: Robust key establishment using human body channel. In: Proc. 3rd USENIX Workshop on Health Security and Privacy (HealthSec).

(Continued)

*Primary Examiner* — Tuan T Lam
(74) *Attorney, Agent, or Firm* — Johns Hopkins Technology Ventures

(57) ABSTRACT

An embodiment in accordance with the present invention provides a system and method of physically modulating a digital signal across a medium. A signal is sent one bit at a time (serially) as a period of high voltage followed by a period of low voltage. The present invention includes several major advantages. One advantage is that the code to execute the method is very lightweight. Another advantage is that the signals require no synchronization source. The signals of the present invention function as their own synchronization.

20 Claims, 3 Drawing Sheets

(56) References Cited

U.S. PATENT DOCUMENTS

| | | | |
|---|---|---|---|
| 7,551,702 B2 * | 6/2009 | Hauser | H04L 7/0331 340/4.2 |
| 8,059,607 B1 | 11/2011 | Shaw et al. | |
| 8,994,498 B2 | 3/2015 | Agrafioti et al. | |
| 9,032,501 B1 | 5/2015 | Martin et al. | |
| 2006/0066371 A1 * | 3/2006 | Takahashi | G01R 31/31709 327/261 |
| 2009/0010241 A1 | 1/2009 | Uchida et al. | |
| 2015/0042450 A1 | 2/2015 | McLear | |
| 2021/0281256 A1 * | 9/2021 | Barthel | H03K 7/08 |

OTHER PUBLICATIONS

Czeskis et al., Rfids and secret handshakes: defending against ghost-and-leech attacks and unauthorized reads with contextaware communications. In: Proceedings of the 15th ACM conference on Computer and communications security. pp. 479-490. ACM (2008).

Gomez et al., Overview and evaluation of bluetooth low energy: An emerging low-power wireless to chnology (2012).

Goode., Bring your own finger—how mobile is bringing biometrics to consumers. Biometric Technology Today 2014(5), 5-9 (2014).

Yan et al., Password memorability and security: Empirical results. IEEE Security and Privacy (Sep. 2004).

Mare et al., Zebra: Zer-oeffort bilateral recurring authentication. In: Security and Privacy (SP), 2014 IEEE Symposium on (May 2014).

Ryan., Bluetooth: With low energy comes low security. In: Proceedings of the 7th USENIX Conference on Offensive Technologies. USENIX Association (2013).

* cited by examiner

PULSE RATIO MODULATION

CROSS-REFERENCE TO RELATED APPLICATIONS

This application is a 35 U.S.C. § 371 U.S. national entry of International Application PCT/US2017/018561, having an international filing date of Feb. 20, 2017, which claims the benefit of U.S. Provisional Application No. 62/296,721, filed Feb. 18, 2016, the content of each of the aforementioned applications is herein incorporated by reference in their entirety.

GOVERNMENT SUPPORT

This invention was made with government support under CNS-1329737 awarded by the National Science Foundation. The government has certain rights in the invention.

FIELD OF THE INVENTION

The present invention relates generally to signal modulation. More particularly the present invention relates to a system and method for data communication via pulse ratio modulation.

BACKGROUND OF THE INVENTION

Electronic or capacitive communication is necessary for the control and operation of a large number of electronics, mechanical devices, computing devices, etc. However, the existing protocols can require large amounts of code, and require a synchronization source for the timing of the signal.

It would therefore be advantageous to provide a system and method for signal modulation that does not require synchronization to physically modulate a digital signal across a medium.

SUMMARY OF THE INVENTION

The foregoing needs are met, to a great extent, by the present invention, wherein in one aspect a system for signal transduction includes a transmission device, wherein the transmission device is configured to transmit a signal. The system includes a reception device, wherein the reception device is configured to receive the signal transmitted by the transmission device. The system also includes a non-transitory computer readable medium programmed for determining a length of the signal transmitted by the transmission device. The non-transitory computer readable medium is also programmed for determining whether the signal transmitted is a high signal or a low signal and determining the continuation of communication based on whether a duration of a last low signal is more than two times a duration of a previous low signal.

In accordance with an embodiment of the present invention, the system includes the signal being one chosen from a group consisting of voltage or capacitance. A voltage used for the signal is between approximately 0 and approximately 5 volts. Code for the transmission of the signal by the transmission device is less than 50 lines, and code for the reception of the signal is less than 50 lines. When the ratio of the time of the high signal to the time of the low signal is greater than 1.5 a bit being transmitted is read as a 1. When the ratio of the time of the high signal to the time of the low signal is less than 1.5 the bit being transmitted is zero. When the time of the low signal is greater than two times the time of the last low signal an end of the communication is triggered. A previous time at low voltage is used as a point of comparison when the end of the communication is triggered. A first bit is captured when an incoming signal voltage goes high, and once the first bit is captured a second bit is being transmitted. A low voltage period is measured and a margin of error (E) is calculated as a portion of the low voltage period. A signal is sent one bit at a time (serially) as a period of high voltage followed by a period of low voltage.

In accordance with another embodiment of the present invention, a method for signal transduction includes determining a length of a signal transmitted by the transmission device. The method includes determining whether the signal transmitted is a high signal or a low signal. Further, the method includes determining whether a ratio of the time of the high signal to the time of the low signal is greater than 1.5, and determining continuation of communication based on whether a duration of a last low signal is more than two times a duration of a previous low signal.

In accordance with yet another aspect of the present invention, the method is executed with a non-transitory computer readable medium. The signal is one chosen from a group of voltage or capacitance. A voltage for the signal is between two discernable voltage levels. The method includes transmitting a bit read as 1, when the ratio of the time of the high signal to the time of the low signal is greater than 1.5 and transmitting a bit read as zero when the ratio of the time of the high signal to the time of the low signal is less than or equal to 1.5. The method includes triggering an end to the communication when the time of the low signal is greater than two times the time of the last low signal. A previous time at low voltage is used as a point of comparison when the end of the communication is triggered. The method also includes capturing a first bit when an incoming signal voltage goes high, and once the first bit is captured a second bit is being transmitted. Additionally, the method includes sending the signal one bit at a time (serially) as a period of high voltage followed by a period of low voltage.

BRIEF DESCRIPTION OF THE DRAWINGS

The accompanying drawings provide visual representations, which will be used to more fully describe the representative embodiments disclosed herein and can be used by those skilled in the art to better understand them and their inherent advantages. In these drawings, like reference numerals identify corresponding elements and.

DETAILED DESCRIPTION

Figure 1:
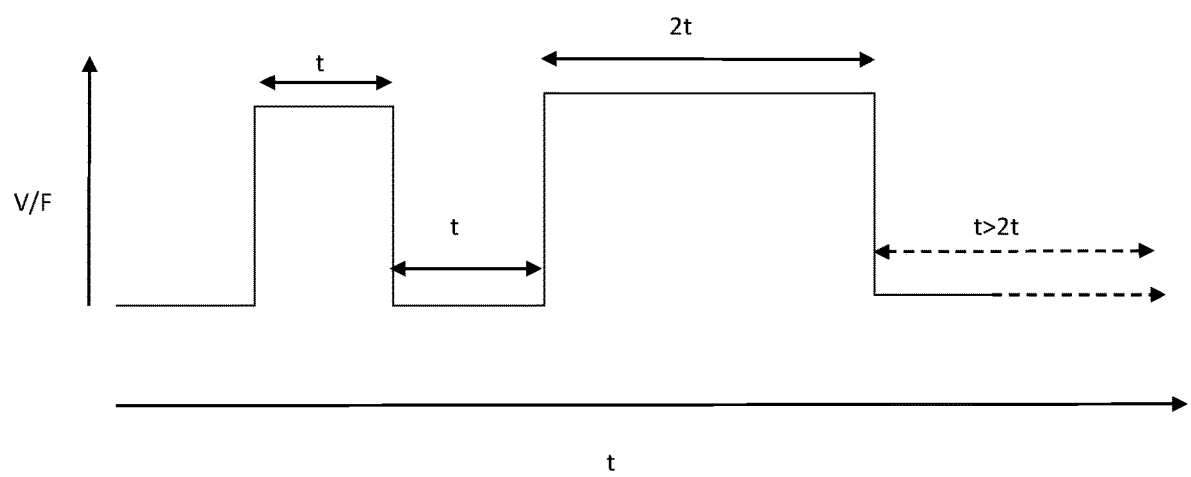
FIG. 1 illustrates a graphical view of the present invention as voltage or capacitance (V/F) is applied over time (t).

The presently disclosed subject matter now will be described more fully hereinafter with reference to the accompanying Drawings, in which some, but not all embodiments of the inventions are shown. Like numbers refer to like elements throughout. The presently disclosed subject matter may be embodied in many different forms and should not be construed as limited to the embodiments set forth herein; rather, these embodiments are provided so that this disclosure will satisfy applicable legal requirements. Indeed, many modifications and other embodiments of the presently disclosed subject matter set forth herein will come to mind to one skilled in the art to which the presently disclosed subject matter pertains having the benefit of the teachings presented in the foregoing descriptions and the associated Drawings. Therefore, it is to be understood that the presently disclosed subject matter is not to be limited to the specific embodiments disclosed and that modifications and other embodiments are intended to be included within the scope of the appended claims.

An embodiment in accordance with the present invention provides a method of physically modulating a digital signal across a medium. A signal is sent one bit at a time (serially) as a period of high voltage followed by a period of low voltage. The present invention includes several major advantages. One advantage is that the code to execute the method is very lightweight. Another advantage is that the signals require no synchronization source or preagreed upon time interval. The signals of the present invention function as their own synchronization.

More particularly, in accordance with an embodiment of the present invention a signal is sent one bit at a time (serially) as a period of high voltage followed by a period of low voltage. When sending a 0, the time (t) of both the high and the low voltage are roughly equal (it, where t equals the duration of the period of high voltage and low voltage). When sending a 1 the time of the high voltage is roughly 2t. The periods of low voltage are always approximately the same length until the end of a message. When the end of the message is reached, the period of low voltage is extended to at least 2t. When the end of the message is reached, the previous time low is used to compare to the previous high that represents the last bit of the signal. Following the extended, long low a 0 signal bit is sent to indicate the termination of the extended, long low. This last 0 signal bit is discarded.

When a device is receiving the messages, the first bit is captured when the incoming signal voltage goes high. Once a full bit is captured i.e. the second bit is being transmitted, the low voltage period is measured and a margin of error (E) is calculated as a portion of the low period (the prototype uses 50%). If the time at high voltage is greater than the time at low voltage plus E, the bit is interpreted as a 1 [t-high>(t-low+E)]. Otherwise, the bit is interpreted as a 0. If the time at low voltage is greater than two times the previous time at low voltage, then the message is understood to be terminated. If the message is terminated, the receiving device should use the previous time at low voltage as the point of comparison.

Advantages to using this modulation method include that the software code to execute the method is very lightweight. In the prototype, the C code to send a message is about 21 lines and the C code to receive a message is about 51 lines. There are also optimizations known to or conceivable by one of skill in the art to reduce these number slightly. Another advantage is that the signals require no synchronization source. The signals function as their own synchronization. This eliminates additional, potentially bulky synchronization code. It doesn't just eliminate synchronization code but also eliminates the need for external synchronization sources such as a clock. Such a method, as that of the present invention eliminates need for pre-agreed upon timing.

FIG. 1 illustrates a graphical view of the present invention as voltage (V/F) is applied over time (t). As illustrated in FIG. 1, when $t_H > 1.5 t_L$ the bit being transmitted is read as a 1. When $t_L > 2 t_{LL}$, this triggers the end of the communication; where $t_H$ is the time duration of the high signal; $t_L$ is the time duration of the low signal and $t_{LL}$ is the time duration of the last low signal. While this document provides a specific voltage range of 0 and 5 volts, it should be noted that any discernable voltages levels known to or conceivable by one of skill in the art can be used in order to transmit the signal.

Figure 2:
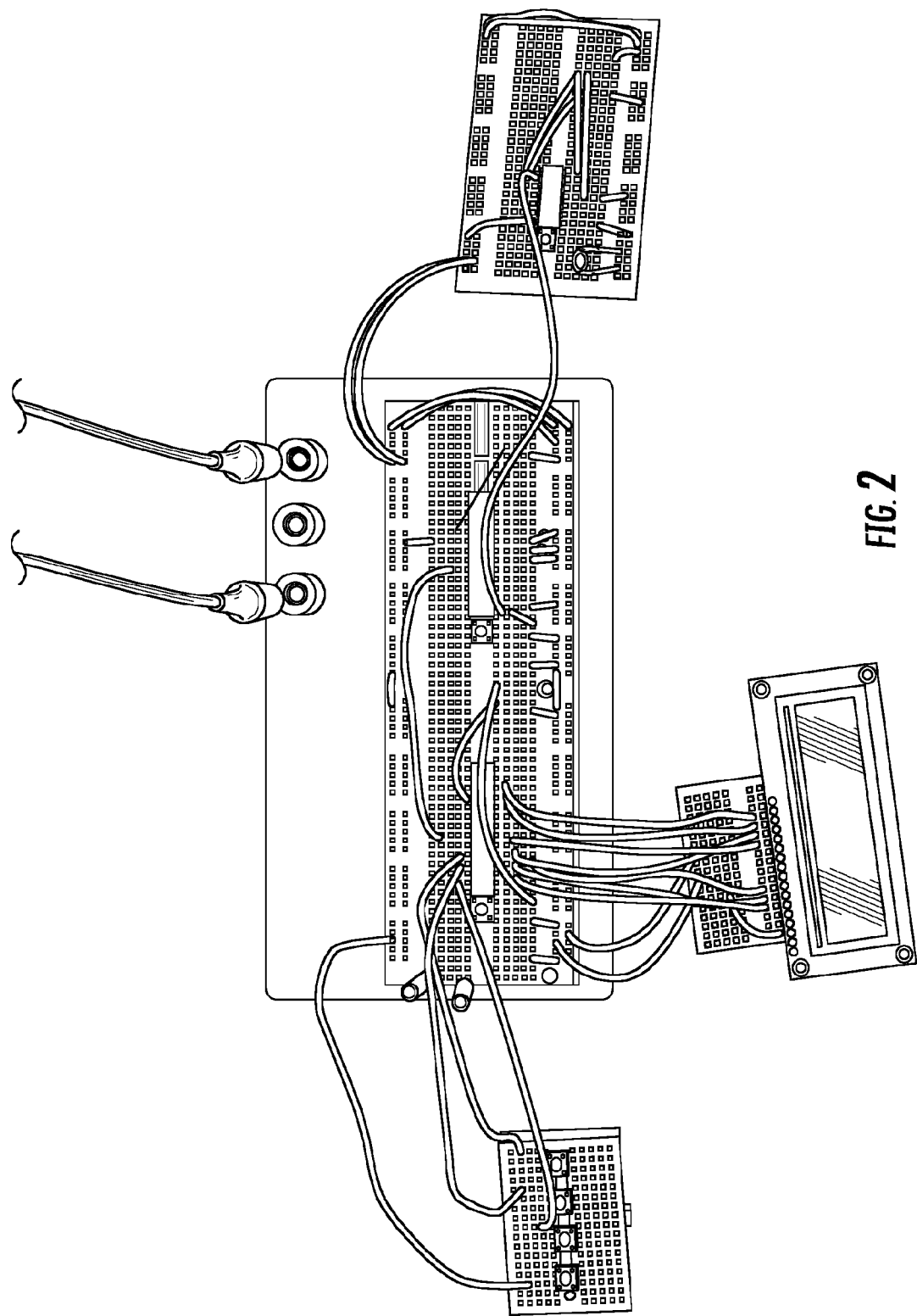
FIG. 2 illustrates an image view of an exemplary Controller Area Network (CAN), according to an embodiment of the present invention.
Figure 3:
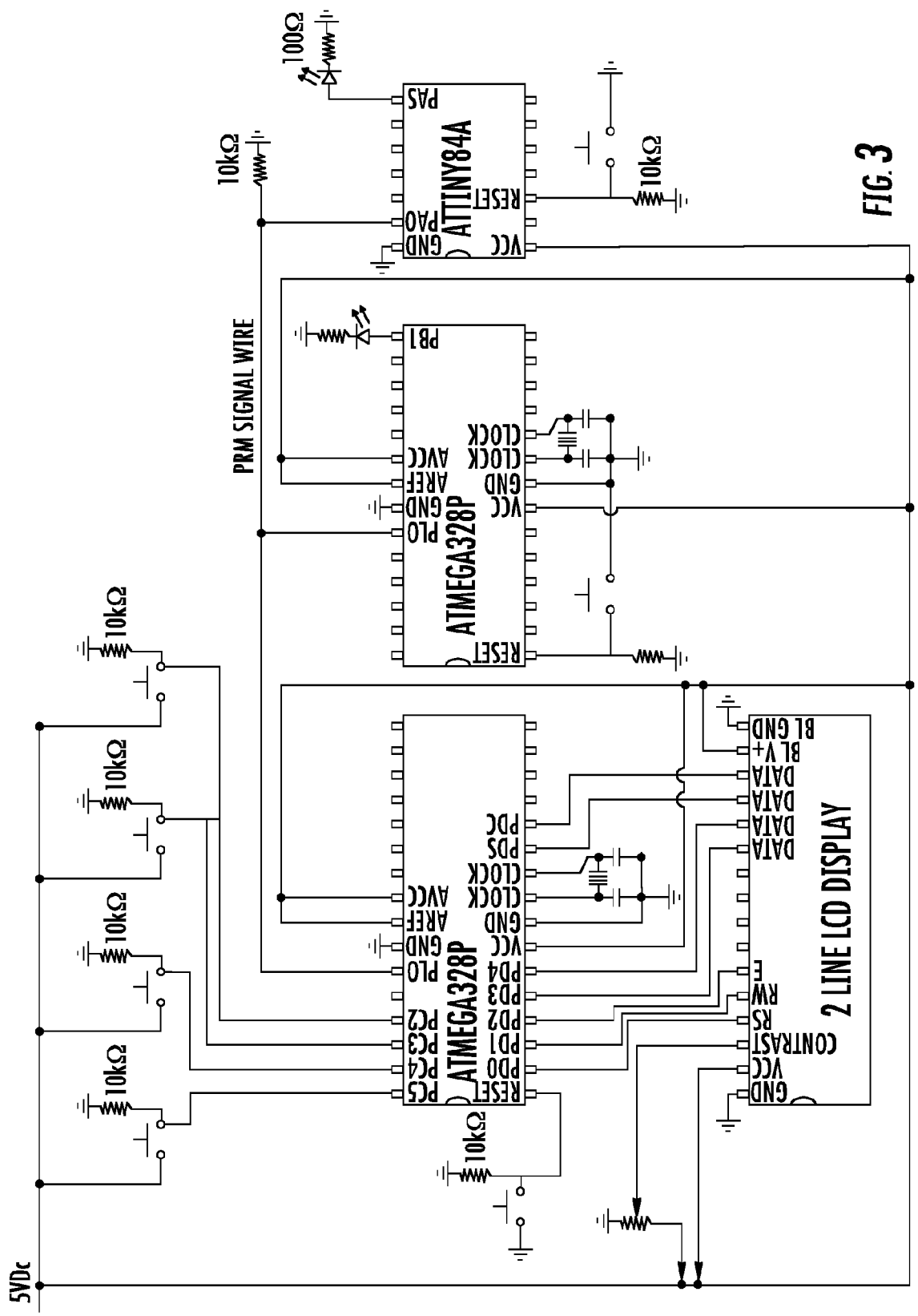
FIG. 3 illustrates a schematic diagram of an exemplary CAN, according to an embodiment of the present invention.

FIG. 2 illustrates an image view of a Controller Area Network (CAN), and FIG. 3 illustrates a schematic diagram of an exemplary CAN, both according to an embodiment of the present invention. FIG. 2 shows a very simple CAN prototype presented as a proof of concept and FIG. 3 illustrates a schematic diagram of the exemplary CAN. CANs are used in industrial and automotive applications, for example. The prototype consists of 3 Atmel AVR based microcontrollers. 2 of the microcontrollers are part number ATMega328-PU and the remaining microcontroller is part number ATTiny84A-PU. The 3 microcontrollers are all powered on the same 5v power supply circuit. One of the ATMega328-PU functions as the "Master" unit. The second ATMega328-PU functions as a subordinate unit. For purposes of this discussion it will be referred to as "Minion 1." The ATTiny84-PU also functions as a subordinate unit. For purposes of this discussion it will be referred to as "Minion 2." Both the Master and Minion 1 operate at a speed of 20 MHz, while Minion 2 operates at a speed of 8 MHz.

Each of the minions has a Light Emitting Diode attached to it which it controls. The master is connected to 4 momentary switches that function as buttons for user input. Also attached to the Master is an LCD panel that provides output to the user to the prototype. All of the microcontrollers are connected to each other by wire attached to a single pin on each microcontroller. This is the wire over which the PRM communication takes place.

A simple protocol was developed for the proof of concept. The section that follows describes the protocol that was developed for the proof of concept. The protocol is deliberately simple for the purpose of illustration and far larger and more complex protocols, both new and existing could be implemented using the current invention.

As mentioned above, each of the minions has an LED attached to one of its pins and the Master has 4 buttons and an LCD panel attached to it. Pressing button 1 will toggle the state (on or off) of the LED attached to Minion 1. Pressing button 2 will toggle the state of the LED attached to Minion 2. Pressing button 3 will get the status of the LED on Minion 1 and display the status on the LCD Panel. Pressing Button 4 will get the status of the LED on Minion 2 and display the status on the LCD Panel.

The protocol consists messages. Each message contains 4 8-bit Bytes. The format of the message is as follows:

| Byte 0 | Byte 1 | Byte 2 | Byte 3 |
|---|---|---|---|
| Receiver Address | Sender Address | Payload Type | Payload |

Each microcontroller is given an address. This address is coded in its software. In the prototype, the Master has the address of 1, Minion 1 has the address of 2, and Minion 2 has the address of 3. When a microcontroller is sending a message, the address of the intended recipient is placed in the "Receiver Address" byte, while the microcontroller's own address is placed in the "Sender Address" byte.

Each microcontroller is given an address. This address is coded in its software. In the prototype, the Master has the address of 1, Minion 1 has the address of 2, and Minion 2 has the address of 3. When a microcontroller is sending a message, the address of the intended recipient is placed in the "Receiver Address" byte, while the microcontroller's own address is placed in the "Sender Address" byte.

The Payload Type byte can be set to either 1 or 2 in this protocol. All other values are disregarded. If the value of the Payload Type is 1, the message is interpreted as a "command." If the value of the payload type is 2, the message is interpreted as a "status."

The meaning of Payload byte depends on the value of the Payload Type byte. If the Payload Type is a "command" then the Payload can be set to either 1 or 2. A "command" with a payload value of 1 is interpreted as a "toggle LED Command." A "command" with a payload value of 2 is interpreted as a "send status command." Command payload values other than 1 or 2 are disregarded.

If the Payload Type is "status" then the Payload can be set to 1, 2, 3, or 4. A "status" with a payload value of 1 is interpreted as a "success" status. A "status" with a payload value of 2 is interpreted as a "failure" status. A "status" with a payload value of 3 is interpreted as a "LED Off" status. A "status" with a payload value of 4 is interpreted as a "LED On" status.

The prototype is configured (in the software) so that the minions will ignore any message that does not have the sender address of the Master (1). Minions also ignore any messages that have their address in the "Receiver Address" field of a message. The Master only issues commands and listens for statuses. The minions only listen for commands and send statuses. The minions are always either waiting for a message or executing a command that the Master has issued. The Master is always waiting for user input, issuing a command or waiting for a status.

The following cases are listed here as a means of understanding a simple implementation of the current invention. Thus these cases only discuss the "normal" flow of events and do not account for any errors that may occur.

When the user presses button 1, the following series of events occurs:
1. The Master constructs a command message for Minion 1 with the payload of 1. The content of the message is [2,1,1,1] where 2 is the address of Minion 1, the first 1 is the address of the Master, the second 1 specifies that this message is a command, and the third 1 specifies that this command is to toggle the LED.
2. The Master sends the message by modulating a voltage on the wire that is attached to all 3 microcontrollers. The modulation is performed in accordance with the current invention.
3. Both Minion 1 and Minion 2 receive the message since they are both physically connected to the communication wire. Minion 2 ignores the message because the "Receiver Address" does not match its own address. Minion 1 processes the message and sees that it is a command to toggle the state of its LED.
4. Minion 1 toggles the state of its LED.
5. Minion 1 constructs a status message for the Master with the Payload of 1 (for success). The content of the message is [1,2,2,1] where the first 1 is the address of the master, the first 2 is the address of Minion 1, the second 2 specifies that this message is a status, and the second 1 specifies a status of "Success."
6. Minion 1 sends the message by modulating a voltage on the wire that is attached to all 3 microcontrollers. The modulation is performed in accordance with the current invention.
7. Both the Master and Minion 2 receive the message since they are both physically connected to the communication wire. Minion 2 ignores the message because the "Receiver Address" does not match its own address. The Master processes the message and sees that it is a "status success" message.
8. The Master Changes the message on the LCD Panel to read "Message Sent All went well."

When the user presses button 2, the following series of events occurs:
1. The Master constructs a command message for Minion 2 with the payload of 1. The content of the message is [3,1,1,1] where 3 is the address of Minion 2, the first 1 is the address of the Master, the second 1 specifies that this message is a command, and the third 1 specifies that this command is to toggle the LED.
2. The Master sends the message by modulating a voltage on the wire that is attached to all 3 microcontrollers. The modulation is performed in accordance with the current invention.
3. Both Minion 1 and Minion 2 receive the message since they are both physically connected to the communication wire. Minion 1 ignores the message because the "Receiver Address" does not match its own address. Minion 2 processes the message and sees that it is a command to toggle the state of its LED.
4. Minion 2 toggles the state of its LED.
5. The Master Changes the message on the LCD Panel to read "Message Sent." Note that when button 2 is pressed, Minion 2 does not send a status after toggling the state of its LED.

When the user presses button 3, the following series of events occurs:
1. The Master constructs a command message for Minion 1 with the payload of 2. The content of the message is [2,1,1,2] where the first 2 is the address of Minion 1, the first 1 is the address of the Master, the second 1 specifies that this message is a command, and the second 2 specifies that this command is a get status command.
2. The Master sends the message by modulating a voltage on the wire that is attached to all 3 microcontrollers. The modulation is performed in accordance with the current invention.
3. Both Minion 1 and Minion 2 receive the message since they are both physically connected to the communication wire. Minion 2 ignores the message because the "Receiver Address" does not match its own address. Minion 1 processes the message and sees that it is a command to report status.
4. Minion 1 constructs a status message for the Master with the Payload of either 3 if its LED is on or 4 if its LED is off. The content of the message is [1,2,2,X] where the 1 is the address of the master, the first 2 is the address of Minion 1, the second 2 specifies that this message is a status, and X is either 3 or 4, depending on the status of the LED attached to Minion 1.
5. Minion 1 sends the message by modulating a voltage on the wire that is attached to all 3 microcontrollers. The modulation is performed in accordance with the current invention.
6. Both the Master and Minion 2 receive the message since they are both physically connected to the communication wire. Minion 2 ignores the message because the "Receiver Address" does not match its own address. The Master processes the message and sees that it is a "status" message.
7. If the payload value of the message is 3, then the Master Changes the message on the LCD Panel to read "Minion1 Status LED OFF." If the payload value of the message is 4 then the Master Changes the message on the LCD Panel to read "Minion1 Status LED ON."

When the user presses button 4, the following series of events occurs:
1. The Master constructs a command message for Minion 2 with the payload of 2. The content of the message is [3,1,1,2] where the 3 is the address of Minion 2, the first 1 is the address of the Master, the second 1 specifies that this message is a command, and the 2 specifies that this command is a get status command.
2. The Master sends the message by modulating a voltage on the wire that is attached to all 3 microcontrollers. The modulation is performed in accordance with the current invention.
3. Both Minion 1 and Minion 2 receive the message since they are both physically connected to the communication wire. Minion 1 ignores the message because the "Receiver Address" does not match its own address. Minion 2 processes the message and sees that it is a command to report status.
4. Minion 2 constructs a status message for the Master with the Payload of either 3 if its LED is on or 4 if its LED is off. The content of the message is [1,3,2,X] where the 1 is the address of the master, the 3 is the address of Minion 2, the 2 specifies that this message is a status, and X is either 3 or 4, depending on the status of the LED attached to Minion 2.
5. Minion 2 sends the message by modulating a voltage on the wire that is attached to all 3 microcontrollers. The modulation is performed in accordance with the current invention.
6. Both the Master and Minion 1 receive the message since they are both physically connected to the communication wire. Minion 1 ignores the message because the "Receiver Address" does not match its own address. The Master processes the message and sees that it is a "status" message.
7. If the payload value of the message is 3, then the Master Changes the message on the LCD Panel to read "Minion1 Status LED OFF." If the payload value of the message is 4 then the Master Changes the message on the LCD Panel to read "Minion1 Status LED ON."

The present invention can be implemented as a method of signal transduction or as a device or system that harnesses the method of signal transduction for various communications protocols. The present invention can be used in any number of implementations known to or conceivable by one of skill in the art, such as a network router.

It should be noted that the methods of the present invention described above can be implemented with a computing device. The computing device can be hard wired or can be networked in a wired or wireless manner. The computing device can also communicate with a server or other remote computing device in order to execute these steps. A non-transitory computer readable medium programmed to execute the methods can be loaded on the computing device or in communication with the computing device. The non-transitory computer readable medium can take any suitable form known to one of skill in the art. The non-transitory computer readable medium is understood to be any article of manufacture readable by a computer or other computing device. Such non-transitory computer readable media includes, but is not limited to, magnetic media, such as floppy disk, flexible disk, hard, disk, reel-to-reel tape, cartridge tape, cassette tapes or cards, optical media such as CD-ROM, DVD, blu-ray, writable compact discs, magneto-optical media in disc, tape, non-volatile memory, or card form, and paper media such as punch cards or paper tape. Alternately, the program for executing the method and algorithms of the present invention can reside on a remote server or other networked device. The computing device can take the form of a PC, tablet, smartphone, processor, microcontroller, network interface, control bus, or any other suitable computing device known to or conceivable by one of skill in the art.

The program can also exist on a specially designed computer or device built with the specifications of the present invention in mind. The computing device is also configured to receive power from outside sources.

The many features and advantages of the invention are apparent from the detailed specification, and thus, it is intended by the appended claims to cover all such features and advantages of the invention which fall within the true spirit and scope of the invention. Further, since numerous modifications and variations will readily occur to those skilled in the art, it is not desired to limit the invention to the exact construction and operation illustrated and described, and accordingly, all suitable modifications and equivalents may be resorted to, falling within the scope of the invention.

What is claimed is:

1. A system for signal transduction comprising:
   a transmission device, wherein the transmission device is configured to transmit a signal;
   a reception device, wherein the reception device is configured to receive the signal transmitted by the transmission device;
   a non-transitory computer readable medium programmed for:
      determining a length of the signal transmitted by the transmission device;
      determining whether the signal transmitted is a high signal or a low signal; and
      determining whether a ratio of the time of the high signal to the time of the low signal is greater than 1.5; and
      determining the continuation of communication based on whether a duration of a last low signal is more than two times a duration of a previous low signal.

2. The system for signal transduction of claim 1 further comprising the signal being one chosen from a group consisting of voltage or capacitance.

3. The system for signal transduction of claim 2 wherein a voltage used for the signal is between two discernable voltage levels.

4. The system for signal transduction of claim 1 further comprising when the ratio of the time of the high signal to the time of the low signal is greater than 1.5 a bit being transmitted is read as a 1.

5. The system for signal transduction of claim 1 further comprising when the ratio of the time of the high signal to the time of the low signal is less than 1.5 a bit being transmitted is zero.

6. The system for signal transduction of claim 1 further comprising when the time of the low signal is greater than two times the time of the last low signal an end of the communication is triggered.

7. The system for signal transduction of claim 6 further comprising a previous time at low voltage being used as a point of comparison when the end of the communication is triggered.

8. The system for signal transduction of claim 1 further comprising a first bit being captured when an incoming signal voltage goes high, and once the first bit is captured a second bit is being transmitted.

9. The system for signal transduction of claim 8 further comprising a low voltage period being measured and a margin of error (E) is calculated as a portion of the low voltage period.

10. The system for signal transduction of claim 1 further comprising the signal being sent one bit at a time (serially) as a period of high voltage followed by a period of low voltage.

11. A method for signal transduction comprising:
determining a length of a signal transmitted by a transmission device;
determining whether the signal transmitted is a high signal or a low signal;
determining whether a ratio of the time of the high signal to the time of the low signal is greater than 1.5; and
determining continuation of communication based on whether a duration of a last low signal is more than two times a duration of a previous low signal.

12. The method of claim 11 further comprising executing the method with a non-transitory computer readable medium.

13. The method of claim 11 further comprising the signal being one chosen from a group consisting of voltage or capacitance.

14. The method of claim 13 further comprising using a voltage for the signal between two discernable voltage levels.

15. The method of claim 11 further comprising transmitting a bit read as 1, when the ratio of the time of the high signal to the time of the low signal is greater than 1.5.

16. The method of claim 11 further comprising transmitting a bit read as zero when the ratio of the time of the high signal to the time of the low signal is less than or equal to 1.5.

17. The method of claim 11 further comprising triggering an end to the communication when the time of the low signal is greater than two times the time of the last low signal.

18. The method of claim 17 further comprising a previous time at low voltage being used as a point of comparison when the end of the communication is triggered.

19. The method of claim 11 further comprising capturing a first bit when an incoming signal voltage goes high, and once the first bit is captured a second bit is being transmitted.

20. The method of claim 11 further comprising sending the signal one bit at a time (serially) as a period of high voltage followed by a period of low voltage.

* * * * *